(12) United States Patent
Kalutarage et al.

(10) Patent No.: US 12,281,382 B2
(45) Date of Patent: Apr. 22, 2025

(54) METHODS FOR DEPOSITING BLOCKING LAYERS ON CONDUCTIVE SURFACES

(71) Applicant: Applied Materials, Inc., Santa Clara, CA (US)

(72) Inventors: Lakmal C. Kalutarage, San Jose, CA (US); Bhaskar Jyoti Bhuyan, San Jose, CA (US); Aaron Dangerfield, San Jose, CA (US); Feng Q. Liu, San Jose, CA (US); Mark Saly, Santa Clara, CA (US); Michael Haverty, Mountain View, CA (US); Muthukumar Kaliappan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 48 days.

(21) Appl. No.: 18/201,442

(22) Filed: May 24, 2023

(65) Prior Publication Data
US 2023/0295794 A1 Sep. 21, 2023

Related U.S. Application Data

(62) Division of application No. 17/315,223, filed on May 7, 2021, now Pat. No. 11,702,733.

(51) Int. Cl.
*C23C 16/04* (2006.01)
*C23C 16/02* (2006.01)
*C23C 16/56* (2006.01)
*H01L 21/02* (2006.01)
*H01L 21/32* (2006.01)

(52) U.S. Cl.
CPC .......... *C23C 16/04* (2013.01); *C23C 16/0272* (2013.01); *C23C 16/56* (2013.01); *H01L 21/02172* (2013.01); *H01L 21/0228* (2013.01); *H01L 21/32* (2013.01); *H01L 21/0217* (2013.01); *H01L 21/02211* (2013.01)

(58) Field of Classification Search
None
See application file for complete search history.

(56) References Cited

U.S. PATENT DOCUMENTS

| | | | |
|---|---|---|---|
| 10,777,411 B1* | 9/2020 | Nguyen | H01L 21/02118 |
| 2017/0137937 A1* | 5/2017 | Arnepalli | C23C 16/4486 |
| 2017/0140920 A1* | 5/2017 | Arnepalli | H01L 21/30621 |
| 2019/0198318 A1* | 6/2019 | Bhuyan | H01L 21/321 |

* cited by examiner

*Primary Examiner* — Jose I Hernandez-Kenney
(74) *Attorney, Agent, or Firm* — Servilla Whitney LLC

(57) ABSTRACT

Methods of selectively depositing blocking layers on conductive surfaces over dielectric surfaces are described. In some embodiments, a 4-8 membered substituted heterocycle is exposed to a substrate to selectively form a blocking layer. In some embodiments, a layer is selectively deposited on the dielectric surface after the blocking layer is formed. In some embodiments, the blocking layer is removed.

5 Claims, 2 Drawing Sheets

METHODS FOR DEPOSITING BLOCKING LAYERS ON CONDUCTIVE SURFACES

CROSS-REFERENCE TO RELATED APPLICATIONS

This application is a divisional of U.S. patent application Ser. No. 17/315,223, filed May 7, 2021, the entire disclosure of which is hereby incorporated by reference herein.

TECHNICAL FIELD

Embodiments of the disclosure relate methods for depositing blocking layers on metallic surfaces. More particularly, embodiments of the disclosure are directed to methods of depositing blocking layers on metallic surfaces to facilitate the deposition of materials on the dielectric surfaces of patterned substrates.

BACKGROUND

The semiconductor industry faces many challenges in the pursuit of device miniaturization which involves rapid scaling of nanoscale features. Such issues include the introduction of complex fabrication steps such as multiple lithography steps and integration of high performance materials. To maintain the cadence of device miniaturization, selective deposition has shown promise as it has the potential to remove costly lithographic steps by simplifying integration schemes.

Selective deposition of materials can be accomplished in a variety of ways. A chemical precursor may react selectively with one surface relative to another surface (metallic or dielectric). Process parameters such as pressure, substrate temperature, precursor partial pressures, and/or gas flows might be modulated to modulate the chemical kinetics of a particular surface reaction. Another possible scheme involves surface pretreatments that can be used to activate or deactivate a surface of interest to an incoming film deposition precursor.

A key challenge in achieving high quality selective deposition is minimizing pin holes in self-assembled monolayers (SAMs) on a blocked surface. Pinholes are one of the main causes of selectivity failure. A higher quality SAM layer can minimize pinholes thereby reducing defects. Another challenge is the removal of the SAM layer after subsequent deposition processes.

Accordingly, there is an ongoing need in the art for treatment methods to deactivate or block conductive surfaces. Further, there is an ongoing need in the art for precursors which provide high quality, pinhole-free SAMs which are readily removed without damage to substrate materials.

SUMMARY

One or more embodiments of this disclosure relate to a method of selectively depositing a blocking layer. The method comprises exposing a substrate comprising a metallic material having a first surface and a dielectric material having a second surface to a blocking compound to selectively form a blocking layer on the first surface over the second surface. The blocking compound comprises a 4-8 member heterocyclic ring comprising at least one heteroatom and at least one substituent group selected from alkyl or aryl groups comprising 1-8 carbon atoms.

Additional embodiments of this disclosure relate to a method of selectively depositing a blocking layer. The method comprises exposing a substrate comprising a metallic material having a first surface and a dielectric material having a second surface to a blocking compound to selectively form a blocking layer on the first surface over the second surface. The blocking compound has a general formula of:

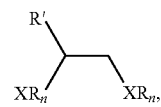

where each X is nitrogen, oxygen, sulfur or phosphorous, n is selected to maintain a neutral charge, R' is selected from hydrogen, alkyl or aryl groups comprising 1-18 carbon atoms, and each R is independently selected from alkyl or aryl groups comprising 1-8 carbon atoms.

Further embodiments of this disclosure relate to a method of selectively depositing a blocking layer. The method comprises exposing a substrate comprising a metallic material having a first surface and a dielectric material having a second surface to a blocking compound to selectively form a blocking layer on the first surface over the second surface. The blocking compound comprises an amine comprising at least one substituent group comprising 1-18 carbon atoms.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
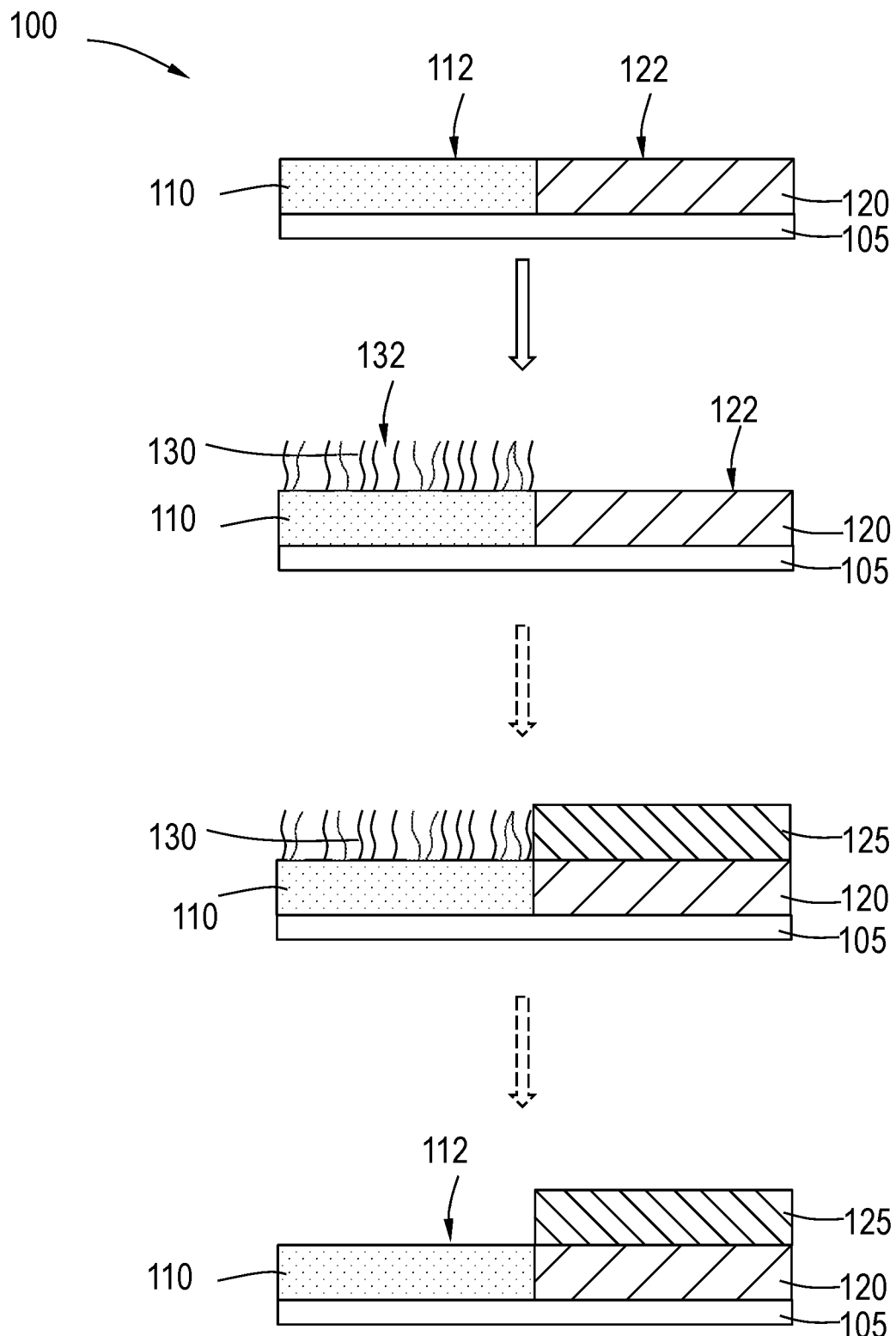
FIG. 1 illustrates a processing method in accordance with one or more embodiment of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Embodiments of the disclosure provide methods for selectively depositing blocking layers on conductive surfaces. Embodiments of the disclosure identify methods for depositing blocking layers which may be used separately or in conjunction.

A "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. Substrates may have various dimensions, such as 200 mm or 300 mm diameter wafers, as well as, rectangular or square panes. In some embodiments, the substrate comprises a rigid discrete material.

Embodiments of the disclosure advantageously provide methods for selectively forming a blocking layer on a conductive surface over a dielectric surface. Some embodiments advantageously provide further methods to selectively deposit a layer on a dielectric surface. Some embodiments advantageously provide further methods to remove the blocking layer from the conductive.

As used in this specification and the appended claims, the phrase "metallic surface" or "dielectric surface" means that the surface relates to a material with the stated composition. Accordingly, a metallic surface is the surface of a metallic material. Similarly, a dielectric surface is the surface of a dielectric material.

As used in this specification and the appended claims, the term "selectively depositing a film on one surface over another surface", and the like, means that a first amount of the film is deposited on the first surface and a second amount of film is deposited on the second surface, where the second amount of film is less than the first amount of film, or no film is deposited on the second surface. The term "over" used in this regard does not imply a physical orientation of one surface on top of another surface, rather a relationship of the thermodynamic or kinetic properties of the chemical reaction with one surface relative to the other surface. For example, selectively depositing a cobalt film onto a copper surface over a dielectric surface means that the cobalt film deposits on the copper surface and less or no cobalt film deposits on the dielectric surface; or that the formation of the cobalt film on the copper surface is thermodynamically or kinetically favorable relative to the formation of a cobalt film on the dielectric surface. In some embodiments, "selectively" means that the subject material forms on the selective surface at a rate greater than or equal to about 10×, 15×, 20×, 25×, 30×, 35×, 40×, 45× or 50× the rate of formation on the non-selected surface. Stated differently, the selectivity for the subject material relative to the non-selected surface is greater than or equal to about 10:1, 15:1, 20:1, 25:1, 30:1, 35:1, 40:1, 45:1 or 50:1.

Some embodiments of the disclosure incorporate a blocking layer typically referred to as a self-assembled monolayer (SAM). A self-assembled monolayer (SAM) consists of an ordered arrangement of spontaneously assembled organic molecules adsorbed on a surface. These molecules are typically comprised of one or more moieties with an affinity for the substrate (head group) and a relatively long, inert, linear hydrocarbon moiety (tail group).

In this case, SAM formation happens through fast adsorption (e.g., chemisorption, physisorption) of molecular head groups at the surface and slow association of molecular tail groups with each other through van der Waals interactions. SAM precursors are chosen such that the head group selectively reacts with the substrate materials to be blocked during deposition. Deposition is then performed, and the SAMs can be removed through thermal decomposition (with desorption of any byproducts), an integration-compatible ashing process, or a plasma0based removal process.

One or more embodiments of this disclosure are directed to methods of selectively depositing a blocking layer on a first surface of a substrate over a second surface. The first surface is the surface of a metallic material. The second surface is a surface of a dielectric material.

The metallic material of the substrate may be any suitable conductive material. Suitable metallic materials include, but are not limited to, metals, metal nitrides, some metal oxides, metal alloys, combinations thereof and other conductive materials. In some embodiments, the metallic material comprises one or more of copper, cobalt, tungsten, tantalum, titanium, ruthenium, iridium, oxides thereof, nitrides thereof or combinations thereof. In some embodiments, the metallic material comprises one or more of chromium, manganese, iron, nickel, oxides thereof, nitrides thereof or combinations thereof. In some embodiments, the metallic material consists essentially of copper, cobalt, tungsten, tantalum, tantalum nitride, tantalum oxide, titanium, titanium oxide, titanium nitride, ruthenium, ruthenium oxide or iridium. As used in this specification and the appended claims, the term "consists essentially of" means that the material is greater than or equal to about 95%, 98% or 99% of the stated material on an atomic basis.

As used in this specification and the appended claims, the term "oxide" or the like means that the material contains the specified element(s). The term should not be interpreted to imply a specific ratio of elements. Accordingly, an "oxide" or the like may comprise a stoichiometric ratio of elements or a non-stoichiometric ratio of elements.

The dielectric material of the substrate may be any suitable material. Suitable dielectric materials include, but are not limited to, silicon oxides (e.g. $SiO_2$), silicon nitrides, silicon carbides and combinations thereof (e.g. SiCON). In some embodiments, the dielectric material consists essentially of silicon dioxide ($SiO_2$). In some embodiments, the dielectric material comprises silicon nitride. In some embodiments, the dielectric material consists essentially of silicon nitride.

Figure 2:
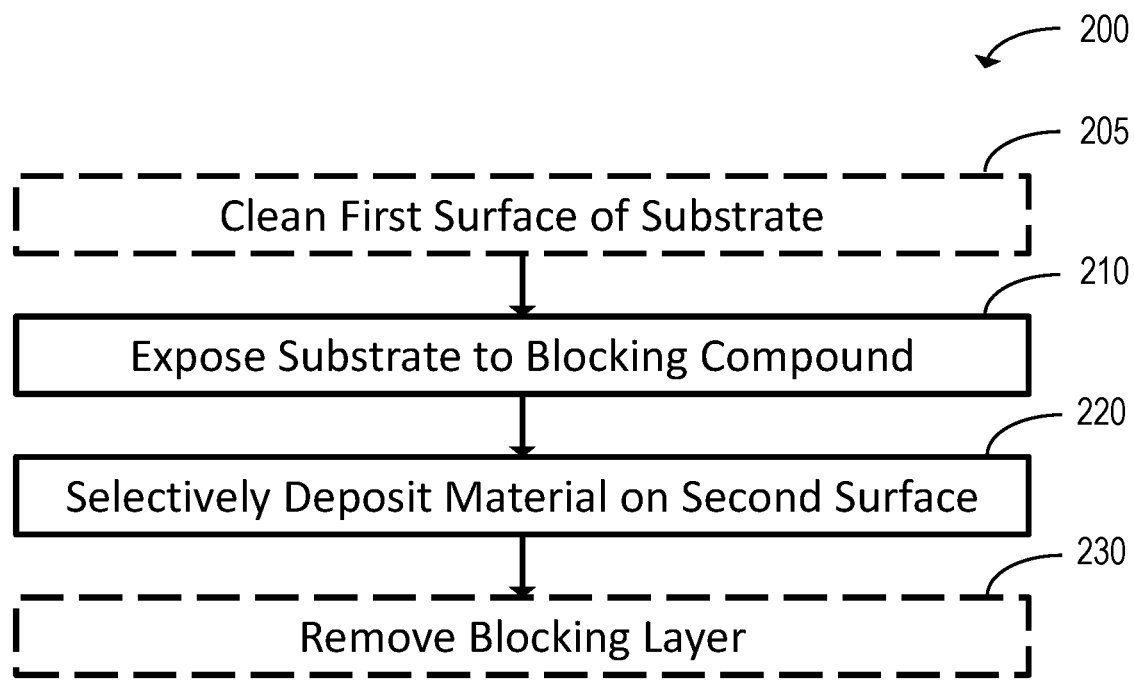
FIG. 2 illustrates a flowchart for a processing method in accordance with one or more embodiment of the disclosure.

Referring to FIGS. 1 and 2, a method 200 begins with a substrate 105 comprising a metallic material 110 having a first surface 112 and a dielectric material 120 having a second surface 122. At 210, the substrate 105 is exposed to a blocking compound (not shown) to selectively form a blocking layer 130 on the first surface 112 over the second surface 122. The blocking layer 130 forms a blocked first surface 132.

In some embodiments, the method 200 continues at 220 by selectively depositing a material 125 on the second surface 122 over the blocked first surface 132. In some embodiments, the material 125 is a dielectric material. In some embodiments, the composition of the material 125 may be selected from same dielectric materials as dielectric material 120. In some embodiments, the material comprises silicon nitride. In some embodiments, the material comprises a metal, metal oxide, metal nitride or dielectric material.

Deposition of the material 125 can be performed through any suitable process. In some embodiments, the material 125 is deposited by atomic layer deposition. Another suitable processes may include exposure of the substrate to a silicon halide and hydrogen gas, an oxidant (e.g., water) or ammonia. Suitable silicon halides include, but are not limited to dichlorosilane (DCS), trichlorosilane (TCS), tetrachlorosilane (SiCl$_4$), tetrabromosilane (SiBr$_4$), tetraiodosilane (SiI$_4$), and hexachlorodisilane (HCDS).

In some embodiments, the material 125 is deposited with a thickness in the range of about 10 Å to about 50 Å, or in the range of about 12 Å to about 35 Å, or in the range of about 15 Å to about 20 Å. In some embodiments, formation of the blocking layer and deposition of the material are repeated until the layer has a thickness of greater than or equal to about 50 Å, greater than or equal to about 75 Å, greater than or equal to about 100 Å or greater than or equal to about 150 Å.

In some embodiments, the method 200 continues at 230 by removing the blocking layer 130 to expose the first surface 112. In some embodiments, the blocking layer 130 is removed using a selective etching processes. Oxygen-based and fluorine-based etches are known to etch carbon based films similar to the blocking layer 130 disclosed herein.

One non-limiting example for removing the blocking layer is via an oxygen-based remote plasma. In this example the oxygen-based remote plasma etch removes the blocking layer but also oxidizes the first surface. To recover the original surface composition, the surface can be reduced. Suitable reduction processes include, but are not limited to, the use of plasmas comprising hydrogen or ammonia and thermal anneals comprising hydrogen or ammonia. In some embodiments, the oxygen plasma, fluorine plasma, hydrogen plasma and ammonia plasma can be independently remotely or internally generated, and conductively coupled or inductively coupled.

Another non-limiting example for removing the blocking layer is via the use of a removal plasma comprising hydrogen plasma (i.e., plasma generated from hydrogen gas), ammonia plasma or combinations thereof. Without being bound by theory, the inventors have found that the removal of blocking layers attached to the metallic material through metal-nitrogen bonds are readily removed by protonating the nitrogen atom, enabling the blocking compound to leave the surface.

In some embodiments, as shown at 205, the method 200 may further comprise cleaning the first surface before exposing the substrate to the blocking compound. In some embodiments, cleaning the first surface comprises exposing the first surface to a solution comprising acetic acid and ethanol. In some embodiments, the solution is a 10% ethanolic solution of acetic acid (i.e., 10% v/v acetic acid in ethanol or 10% w/w acetic acid in ethanol).

In some embodiments, cleaning the first surface comprises exposing the first surface to hydrogen gas or ammonia. In some embodiments, the hydrogen gas or ammonia is ignited to form a plasma (e.g., hydrogen plasma). In some embodiments, the plasma is a conductively coupled plasma (CCP). In some embodiments, the plasma is an inductively coupled plasma (ICP).

Without being bound by theory, it is believed that cleaning the first surface results in a higher prevalence of H-terminations or N-terminations on the first surface. These terminations are believed to be the reaction sites for the blocking compound.

In some embodiments, the blocking compound comprises a 4-8 member heterocyclic ring comprising a heteroatom and at least one substituent group selected from hydrogen, alkyl or aryl groups comprising 1-8 carbon atoms. In some embodiments, the substituent group is not hydrogen. In some embodiments, the heteroatom is selected from nitrogen, oxygen, sulfur or phosphorous. In some embodiments, the heterocyclic ring is aromatic.

A non-limiting list of exemplary blocking compounds includes:

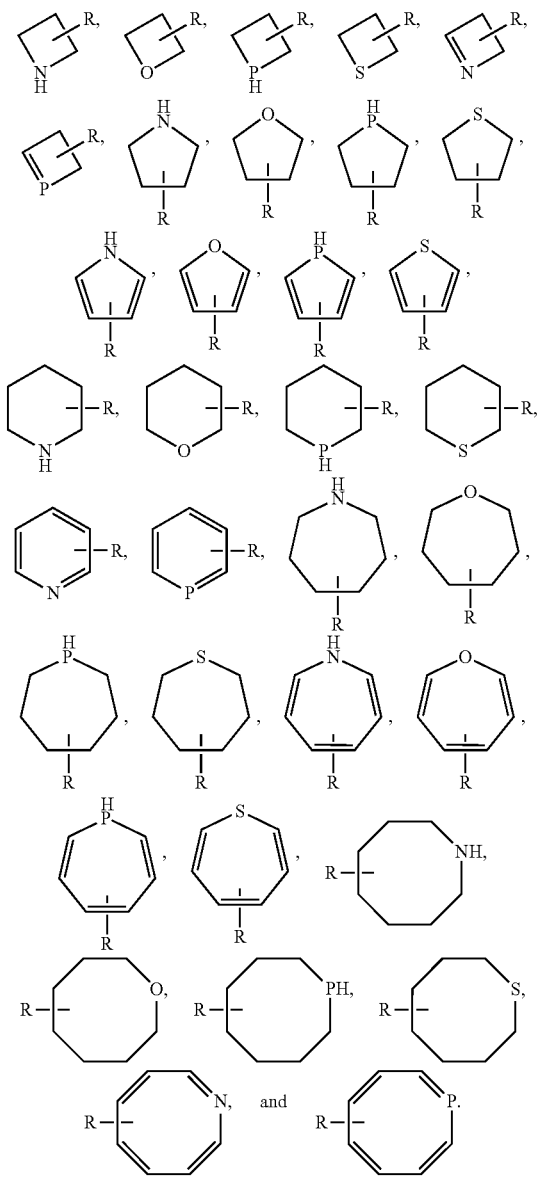

For each of the above compounds, the R group represents an alkyl or aryl group comprising 1-8 carbon atoms and may be pendant from the ring at any suitable location.

In some embodiments, the heterocyclic ring comprises more than one heteroatom. In some embodiments, the heterocyclic ring comprises 2 heteroatoms. In some embodiments, all the heteroatoms of the heterocyclic ring are the same. In some embodiments, the heteroatoms are positioned adjacent (e.g. substituted pyrazolidine). In some embodiments, the heteroatoms are positioned with at least one intervening carbon atom (e.g. substituted imidazolidine).

A further non-limiting list of blocking compounds includes:

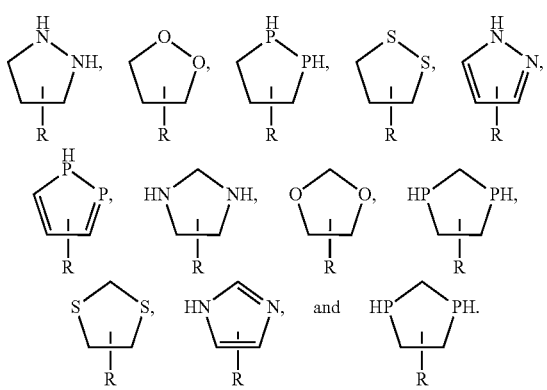

In some embodiments, the heterocyclic ring is substituted with an aminomethyl group at the 2 carbon. Stated differently, in some embodiments, the heterocyclic ring is a 2-aminomethyl heterocycle. An exemplary blocking compound substituted at the 2 carbon with an aminomethyl group is

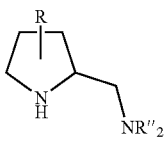

In some embodiments, each R″ is selected from hydrogen, or an alkyl group comprising 1 to 4 carbon atoms.

In some embodiments, the blocking compound has a general formula of:

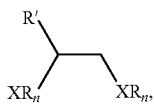

where each X is nitrogen, oxygen, sulfur or phosphorous, n is selected to maintain a neutral charge, R' is selected from hydrogen, alkyl or aryl groups comprising 1-18 carbon atoms, and each R is independently selected from alkyl or aryl groups comprising 1-8 carbon atoms. In some embodiments, each X is the same.

In some embodiments, the blocking compound comprises an amine comprising at least one substituent group comprising 1-18 carbon atoms. In some embodiments, the amine is a primary amine (R'NH$_2$). In some embodiments, the amine is a secondary amine (R'$_2$NH). In some embodiments, the amine is a tertiary amine (R'$_3$N). In the case of a secondary amine or tertiary amine, the substituent groups R' may be the same or different. In some embodiments, at least one R' group comprises 4-18 carbon atoms, 6-18 carbon atoms, 8-18 carbon atoms, or 12-18 carbon atoms. In some embodiments, the substituent group does not contain silicon.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of selectively depositing a blocking layer, the method comprising exposing a substrate comprising a metallic material having a first surface and a dielectric material having a second surface to a blocking compound to selectively form a blocking layer on the first surface over the second surface, the blocking compound having a general formula of:

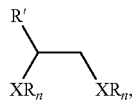

where each X is independently selected from the group consisting of oxygen, sulfur, or phosphorous, n is selected to maintain a neutral charge, R' is selected from hydrogen, alkyl or aryl groups comprising 1-18 carbon atoms, and each R is independently selected from alkyl or aryl groups comprising 1-8 carbon atoms.

2. The method of claim 1, wherein the metallic material comprises one or more of copper, cobalt, tungsten, tantalum, titanium, ruthenium, iridium, oxides thereof, nitrides thereof or combinations thereof.

3. The method of claim 1, further comprising selectively depositing a material on the second surface after selectively forming the blocking layer.

4. The method of claim 3, wherein the material comprises a metal, metal oxide, metal nitride or dielectric material.

5. The method of claim 1, further comprising exposing the substrate to a removal plasma comprising hydrogen plasma, ammonia plasma or a combination thereof to remove the blocking layer from the first surface.

* * * * *